United States Patent [19]
Wells et al.

[11] Patent Number: 5,474,591
[45] Date of Patent: Dec. 12, 1995

[54] METHOD OF SYNTHESIZING III-V SEMICONDUCTOR NANOCRYSTALS

[75] Inventors: Richard L. Wells; Shreyas S. Kher, both of Durham, N.C.

[73] Assignee: Duke University, Durham, N.C.

[21] Appl. No.: 189,232

[22] Filed: Jan. 31, 1994

[51] Int. Cl.$^6$ ............................ C22C 12/00; C22C 28/00; C01B 25/08; C01B 35/04
[52] U.S. Cl. ............................ 75/351; 420/528; 420/555; 420/576; 420/579; 420/903; 423/289; 423/299; 252/62.3 GA
[58] Field of Search ............................ 75/351; 252/62.3 GA; 117/921; 423/289, 299; 420/528, 555, 576, 579

[56] References Cited

U.S. PATENT DOCUMENTS

| | | |
|---|---|---|
| 4,798,701 | 1/1989 | David. |
| 4,902,486 | 2/1990 | Theopold et al. ........................ 423/122 |
| 5,023,139 | 6/1991 | Birnboim et al. ........................ 428/402 |
| 5,084,128 | 1/1992 | Baker ............................... 252/62.3 GA |
| 5,215,631 | 6/1993 | Westfall ................................... 156/600 |
| 5,262,357 | 11/1993 | Alivisatos et al. ........................ 437/233 |

OTHER PUBLICATIONS

Richard L. Wells, "The Use of Silylarsines to Prepare Gallium–Arsenic Compounds", Coord Chem Rev 112 (1992) 273–291.
Weller, "Quantized Semiconductor Particles: A Novel State of Matter for Materials Science", Advanced Materials 5(2):88–95 (1993).
Stucky, "The Interface of Nanoscale Inclusion Chemistry", Progress in Inorganic Chemistry 40:99–179 (1992).
Stucky et al, "Quantum Confinement and Host/Guest Chemistry: Probing a New Dimension", Science 24:669–678 (1990).
Steigerwald et al, "Semiconductor Crystallites: A Class of Large Molecules", Acc. Chem. Res. 23(6):183–188 (1990).
Siegel, "Exploring Mesoscopia: The Bold New World of Nanostructures", Physics Today 46(10):64–68 (1993).
Goldstein et al, "Melting in Semiconductor Nanocrystals", Science 256:1425–1427 (1992).
Wells et al, "Use of Tris(trimethylsilyl)arsine To Prepare Gallium Arsenide and Indium Arsenide", Chemistry of Materials 1(1):4–6 (1989).
Wells et al, "The Use of Tris(trimethylsily)arsine to Prepare AlAs, GaAs and InAs. The X–Ray Crystal Structure of $(Me_3Si)AsAlCl_3$–$C_7H_8$", Mat. Res. Soc. Symp. Proc. 131:45–50 (1989).
Wells et al, "Preparation of a Novel Gallium Arsenide Single–Source Precursor Having the Empirical Formula $AsCl_3Ga_2$", Chem. Mater. 3:381–382 (1991).
Wells et al, "Synthesis, Characterization, and Thermal Decomposition of $[Cl_2GaP(SiMe_3)_2]_2$, a Potential Precursor to Gallium Phosphide", Organometallics 12(7):2832 (1993).
Aubuchon et al, "Preparation, Characterization and Facile Thermolysis of $pX_2GaP(SiMe_3)_2]_2$ (X=Br, I) and $Cl_3Ga_2P)n$: New Precursors to Nanocrystalline Gallium Phosphide", Chem. Mater. 6(1):82–86 (1994).
Butler et al, "Preparation and Spectroscopic Characterization of Highly Confined Nanocrystallites of GaAs in Decane", J. Phys. Chem. 97:10750–10755 (1993).
Olshavsky et al, "Organometallic Synthesis of GaAs Crystallites Exhibiting Quantum Confinement", J. Am. Chem. Soc. 112:9438–9439 (1990).

(List continued on next page.)

*Primary Examiner*—David A. Simmons
*Assistant Examiner*—Margery S. Phipps
*Attorney, Agent, or Firm*—Nixon & Vanderhye

[57] ABSTRACT

The present invention relates, in general, to a method of synthesizing nanocrystals and, in particular, to a method of synthesizing III-V semiconductor nanocrystals in solution at a low temperature and in a high yield. The method comprises the combination of mixing a Na/K alloy with an excess of Group VA element (E) in an aromatic solvent to form a $(Na/K)_3E$ pnictide, and subsequently mixing the pnictide with a Group IIIA trihalide $(MX_3)$ in a coordinating solution to form a suspension that includes the nanocrystalline semiconductor.

12 Claims, 6 Drawing Sheets

OTHER PUBLICATIONS

Uchida et al, "GaAs Nanocrystals Prepared in Quinoline", J. Phys. Chem. 95:5382–5384 (1991).

Uchida et al, "Optical Properties of GaAs Nanocrystals", J. Phys. Chem. 96:1156–1160 (1992).

Uchida et al, "Preparation and Optical Nonlinearity of Quantized InAs Nanocrystals", Chem. Mater. 5:716–719 (1993).

Treece et al, "Sythesis of III–V Semiconductors by Solid–State Metathesis", Inorg. Chem. 32:2745–2752 (1993).

Treece et al, "From Ceramics to Superconductors: Rapid Materials Synthesis by Solid–State Metathesis Reactions", Mat. Res. Soc. Symp. Proc. 271:169–175 (1992).

Treece et al, "Rapid Synthesis of GaP and GaAs from Solid–State Precursors", Chem. Mater. 4:9–11 (1992).

Wiley et al, "Rapid Solid–State Precursor Synthesis of Materials", Science 255:1093–1097 (1992).

Peterson et al, "Preparation and Methylation of Alkali Metal Phosphides", J. Inorg. Nucl. Chem. 28:53–60 (1966).

"X–Ray Diffraction Procedures for Polycrystalline and Amorphous Materials", Harold P. Klug and Leory E. Alexander, New York, John Wiley & Sons, Inc., London.

Sandroff et al, "GaAs Clusters in the Quantum Size Regime: Growth on High Surface Area Silica by Molecular Beam Epitaxy", Science 245:391–393 (1989).

Comprehensive Coordination Chemistry, The Synthesis, Reactions, Properties & Applications of Coordination Compounds, vol. 3, editor–in–chief Sir Geoffrey Wilkinson, eds. Robert D. Gillard, Jon A. McCleverty, Pergamon Press.

Bock et al, "Solution of Gallium Trichloride in Ethers: A $^{71}$Ga NMR Study and the X–Ray Structure of $GaCl_3$. Monoglyme", Z. Naturforsch, 45b:979–984 (1990).

Noth et al, "An Investigation of $AlCl_3$ Solutions in Ethers by $^{27}$Al NMR Spectroscopy", Z. Naturforsch. 37b:29–37 (1982).

EDXA (Performed on a TEM instrument) of InP

FIG. 3C

XRD Pattern of InP Synthesized in Triglyme/Toluene Mixed Solvent

FIG. 7

METHOD OF SYNTHESIZING III-V SEMICONDUCTOR NANOCRYSTALS

TECHNICAL FIELD

The present invention relates, in general, to a method of synthesizing nanocrystals and, in particular, to a method of synthesizing III-V semiconductor nanocrystals in solution at a low temperature and in a high yield.

BACKGROUND OF THE INVENTION

Semiconductor nanocrystals have been intensely investigated in recent years. The properties of these crystals differ from those of the bulk solids (Weller, Adv. Mater. 5:88 (1993); Stucky, Prog. Inorg. Chem. 40:99 (1992); Stucky and MacDougall, Science 247:669 (1990); Brus and Steigerwald, Acc. Chem. Res. 23:183 (1990); Siegel, Physics Today, p. 64 (October 1993)). For example, reduced melting temperatures of nanocrystals make possible low-temperature routes of thin-film formation (Siegel, Physics Today, p. 64 (October 1993); Goldstein et al, Science 256:1425 (1992)).

Synthesis of nanocrystalline semiconductors (or their precursors) has been effected using silyl cleavage. Specifically, Group III halides have been reacted with $E(SiMe_3)_3$ (E=P, As) in hydrocarbon solvents to yield nanocrystalline III-V (13-15) semiconductors (or their precursors) (Wells et al, Chem. Mater. 1:4 (1989); Wells et al, Mater. Res. Soc. Symp. Proc. 131:45 (1989); Wells et al, Chem. Mater. 3:382 (1991); Wells et al, Organometallics 12:2832 (1993); Aubuchon et al, Chem. Mater. January (1994)). Synthesis of GaAs nanocrystals in decane has also been reported (Butler et al, J. Phys. Chem. 97:10750 (1993)). Silyl cleavage has also been used to synthesize GaAs nanocrystals in quinoline (Olshavsky et al, J. Am. Chem. Soc. 112:9438 (1990); Uchida et al, J. Phys. Chem. 95:5382 (1991)). In addition, the synthesis of GaAs and InAs nanocrystals from $Ga(acac)_3$ and $In(acac)_3$, respectively, by reactions with $As(SiMe_3)_3$, has been described. However, the formation of byproducts and the fate of the acetylacetonate ligands were not reported (Uchida et al, J. Phys. Chem. 96:1156 (1992); Uchida et al, Chem. Mater. 5:716 (1993)).

Recently Kaner and co-workers reported a general method of synthesizing binary III-V semiconductors involving solid state metathesis (SSM). According to this method, sodium pnictides are reacted with Group III halides, either in bombs or sealed glass ampules, at high temperatures. These exothermic reactions generate enough heat to melt the sodium halide product. SSM reactions, therefore, often yield polycrystalline III-V semiconductors contaminated with starting materials and byproducts (Treece et al, Inorg. Chem. 32:2745 (1993); Treece et al, Mater. Res. Soc. Symp. Proc. 271:169 (1992); Treece et al, Chem. Mater. 4:9 (1992); Wiley and Kaner, Science 255:1093 (1992)).

An important aspect of Kaner's work involved controlling the particle size by adding inert materials as heat sinks to the SSM reaction mixtures. The particle size of $MoS_2$, synthesized from SSM reaction between $MoCl_5$ and $Na_2S$, was altered by the amount of NaCl added to the reactants. The greater the amount of NaCl, the smaller the particle size of $MoS_2$ obtained (Wiley and Kaner, Science 255:1093 (1992)).

The present invention avoids the severe conditions and high temperatures of the SSM reactions that result in polycrystalline semiconductor powders contaminated with undesirable materials such as byproducts and unreacted starting materials. The present invention provides a low temperature, solution phase approach to the production of nanocrystalline III-V semiconductors that avoids the use of highly toxic and pyrophoric hydrides as well as pyrophoric and air-sensitive Group III alkyl compounds.

OBJECTS AND SUMMARY OF THE INVENTION

It is a general object of the invention to provide a method of synthesizing nanocrystalline semiconductors.

It is a specific object of the invention to provide a safe and energy efficient method of synthesizing nanocrystalline III-V semiconductors.

It is another object of the invention to provide a method of nanocrystalline semiconductor synthesis that results in high yields.

The objects of the invention are met by a method of synthesizing Group III-V nanocrystalline semiconductors comprising the steps of:

i) mixing sodium/potassium (Na/K) alloy with an excess of a Group VA (E) element in an aromatic solvent under conditions such that a pnictide $((Na/K)_3E)$ is formed;

ii) mixing the $(Na/K)_3E$ resulting from step (i) in situ with a solution comprising a Group IIIA trihalide $(MX_3)$ and, advantageously, a coordinating solvent, under conditions such that a suspension comprising the Group III-V nanocrystalline semiconductor (ME) and $(Na/K)X$ is formed; and iii) isolating the ME resulting from step (ii).

Further objects and advantages of the present invention will be clear from the description that follows.

BRIEF DESCRIPTION OF THE DRAWINGS

FIG. 1A. 36 nm GaAs formed on adding $GaCl_3$ solution in toluene and refluxing.

FIG. 1B. 10 nm GaAs resulted on adding $GaCl_3$ dissolved in diglyme and refluxing.

FIG. 1C. 22 nm crystallites formed on doubling the amount of reactants in FIG. 1B while using the same amounts of solvent.

FIG. 1D. 8 nm GaAs crystallites formed on adding $GaCl_3$ solution in diglyme and stirring at room temperature without refluxing.

FIG. 1E. 6 nm GaAs obtained on using $GaI_3$ solution in diglyme and refluxing.

FIG. 2A. 21 nm GaP formed on adding $GaCl_3$ solution in toluene followed by refluxing.

FIG. 2B. 11 nm GaP resulted when $GaCl_3$ solution in diglyme was added followed by refluxing the reaction mixture.

FIG. 3. Synthesis of InP crystallites from $InI_3$ and $(Na/K)_3P$.

DETAILED DESCRIPTION OF THE INVENTION

The present invention relates to a general method for high yield, solution phase synthesis of nanocrystalline III-V semiconductors. The present method eliminates the use of substituted or unsubstituted Group V hydrides and Group III alkyls. The method can be described by reference to the following:

(1)

$$(Na/K)_3E + MX_3 \rightarrow ME + 3(Na/K)X \quad (2)$$

wherein

E=P, As or Sb;

M=In, Ga, Al and B; and

X=I, Cl or Br.

Advantageously, E is P, As or Sb, M is In or Ga and X is I or Cl. Preferably, M is In and X is I, or M is Ga and X is Cl or I.

The sodium/potassium pnictide of step (i) above can be synthesized from the elements by refluxing in an aromatic solvent (see Peterson and Logan, J. Inorg. Nucl. Chem. 28:53 (1966)). Refluxing in toluene in an argon atmosphere is preferred when Na/K is reacted with P or As and refluxing in xylene in an argon atmosphere is preferred when Na/K is reacted with Sb. A minimum 30% excess is advantageously used when E is P, an excess of greater than 10% is advantageously used when E is As or Sb.

After refluxing, for example, for a period of about two days (eg, until formation of $(Na/K)_3E$ is complete), the reaction is cooled, for example, to about 0° C. The Group III trihalide, advantageously, dissolved in a coordinating solvent (for example, diglyme, monoglyme or triglyme), is added to the resulting $(Na/K)_3E$ and the solution is then heated for example, to reflux temperatures. After refluxing, for example, for 1–2 days (eg, until the reaction is complete), the reaction is then cooled. Subsequent work-up affords the semiconductor as a powder.

When P is used, the subsequent work-up preferably involves the addition to the reaction, under an inert atmosphere (eg argon), of alcohol (eg, ethanol) or an alcohol (eg, ethanol)/water (eg deionized water) mixture. For As and Sb reactions, addition of water alone is preferred. Alcohol can be used, however, alcohol does not dissolve (Na/K)Cl (alcohol does, however, dissolve (Na/K)I). Thus water can be used to extract (Na/K)X after $(Na/K)_3As$ (for example) is destroyed by addition of alcohol (eg, absolute alcohol). The $(Na/K)_3E$ can be destroyed by adding alcohol and (Na/K)X can be removed by subsequently washing with water (eg, during filtration, note below). The reaction is subsequently stirred for about 15 min. under an inert atmosphere (eg argon) and then for an additional period in air. The addition of water or alcohol/water under inert atmosphere can be important as unreacted pnictides can react with water producing Group V hydrides which are highly toxic. The period of stirring under inert atmosphere allows for the destruction of unreacted pnictides and the further period of stirring in air assures complete destruction of any remaining unreacted pnictides.

The particles present in the suspension resulting from the procedure described above are harvested, for example, by vacuum filtration, in air. The solid material obtained is treated, for example, by washing with de-ionized water, to remove sodium and potassium halide and unreacted Group III metal halides. Solvent washing (eg acetone washing) can be used to remove water from the powder and to extract any water insoluble byproducts. Excess P and As can be removed, for example, by sublimation. More specifically, the resulting powder can be air dried (for example, overnight) and then heated, for example, to 350° C. over a period of about 45 minutes in a sublimer under dynamic vacuum and maintained at that temperature for a period of time sufficient to effect sublimation of the excess P and As (eg, about 3 hours) which can be collected on a cold finger. Sb does not sublime and, when used, can be expected to be present in the final product as a contaminant.

The method of semiconductor nanocrystalline synthesis described above is associated with yields in the range of 53 to 95%. A wide range of particle sizes can be achieved, eg about 3–38 nm. Due to the different bulk band gaps of different semiconductors, the preferred size range varies. For GaAs, for example (band gap 1.52 ev), the preferred particle size is less than 19 nanometers. For InSb (band gap 0.17 ev) the upper limit of the preferred particle size is greater than 19 nanometers, for example 30 nm.

As will be clear from the Examples that follow, various factors affect particle size, including the use of a coordinating solvent, the nature of the halide used and the temperature and concentration employed. Coordinating solvents are known to form complexes with Group IIIA halides. These solvents break up the dimeric structure of the halides. Dimeric halides, such as $GaCl_3$, $GaI_3$ and $InI_3$, yield nanocrystalline materials whereas oligomeric halides, for example, $InCl_3$ and InBr3, tend to yield semiconductors with larger particle size. As to the effect of temperature, higher reaction temperatures are known to improve crystallinity of the final products in other systems due to grain growth. Concentration also affects particle size. Lower concentrations are likely to cause better heat dissipation from the reacting species, thereby reducing the effective temperature at reactions sites. This aids in the production of smaller crystallites.

Group III-V semiconductors are well known for their optoelectronic properties and are widely used for semiconductor lasers and nonlinear optical materials. Due to the high electron mobility in III-V semiconductors, high speed circuits have been fabricated from these and are in use. Semiconductor quantum dots (Nanocrystals) have been known to possess a variety of band gaps (depending on particle size), as opposed to the bulk material which exhibits a single band gap. Due to their optoelectronic properties, nanocrystals are ideal candidates for solar collectors for solar energy conversion since the solar radiation covers a wide range of wavelengths. Indium phosphide (InP) is the best known material for solar collectors due to its high resistance to radiational damage. Nanocrystalline materials have been reported to melt at greatly reduced temperatures relative to bulk materials and thus they can be used to make high purity thin films of Group III-V semiconductors at much lower temperatures and can circumvent the need for the use of expensive, and often pyrophoric and highly toxic, precursors for thin film deposition of these compounds.

The non-limiting Examples that follow describe certain aspects of the invention in greater detail. Specifically, the Examples describe in some detail the solution phase synthesis of nanocrystalline GaAs and GaP. The Examples demonstrate that reactions carried out in aromatic solvents yield III-V materials with considerably smaller particles than achieved using prior methods and that further reduction in the particle size can be achieved by using coordinating solvents.

EXAMPLES

Synthesis of Nanocrystalline III-V Semiconductors $(NaK)_3E$ (E=P, As) was synthesized in situ under an argon atmosphere by combining sodium/potassium alloy with excess arsenic powder or excess white phosphorus in refluxing toluene (Peterson and Logan, J. Inorg. Nucl. Chem. 28:53 (1966)) for two days. To this was added a $GaX_3$ (when E=As, X=Cl,I; when E=P, X=Cl) solution in diglyme. The mixture was refluxed for 1–2 days. On cooling, deionized water was added to the GaAs reaction mixture under inert atmosphere to destroy any unreacted arsenide and to dissolve the alkali metal halide products. In the case of the GaP reactions, an ethanol/de-ionized water solution was added for the same purpose due to solubility of unreacted white phosphorus in ethanol (Windholz, M., Ed.; Merck & Co.: New Jersey, The Merck Index, p. 7232 (1983)). The resulting suspension was then vacuum filtered in air and the solid collected on the filter paper washed with copious amounts of deionized water followed by washing with acetone and air drying. The dry solid was heated to 350° C. in a sublimator under dynamic vacuum for 2–3 hrs to remove excess Group V element.

The resulting light to dark brown materials were GaAs and GaP nanocrystals with approximate average particle size range from 6–22 nm as calculated from the XRD patterns using the Scherrer equation (Klug and Alexander, X-Ray Diffraction Procedures, John Wiley & Sons, Inc: New York, p. 491 (1962)). Due to symmetry of the (220) reflection, it was used for calculating the particle sizes for GaAs and GaP. However, for some of the samples, there seemed to be a broad hump in the XRD patterns near 35 degrees two-theta angle. The origin of this feature is likely to be due to $Ga_2O_3$.

The yields of the reactions ranged from 53% to over 80% (for GaAs and GAP). The elemental analysis of GaAs powders indicated that there was a slight excess of gallium in the samples giving the Ga:As ratio of 5.1:4.0. Butler et al (J. Phys. Chem. 97:10750 (1993)) and Olshavsky et al (J. Am. Chem. Soc. 112:9438 (1990)) have reported similar excesses of gallium (Ga:As ratio 5:4) in nanocrystalline GaAs prepared from $GaCl_3$ and $As(SiMe_3)_3$. Sandroff et al reported surface oxidation of nanocrystalline GaAs exposed to air resulted in 1–1.5 nm layers of $Ga_2O_3$ and $As_2O_3$ (Sandroff et al (Science 245:391 (1989)). The depth of this oxide layer may be quite significant with decreasing particle size of gallium arsenide. $As_2O_3$ is known to sublime at 193° C. (Weast, R. C. Ed., CRC Press, Inc: Boca Raton, CRC Handbook of Chemistry and Physics 66:B-74 (1985)) and would do so during the vacuum sublimation carried out at 350° C. to remove excess arsenic. This would effectively increase the amount of gallium in the specimen relative to arsenic. Elemental analysis of a typical GaP sample gave the Ga:P ratio of 1.1:1.0. The elemental analyses also indicated that the halogen content of both the semiconductors was typically below 0.01% and that small amounts of carbon and hydrogen were present.

Figure 1:
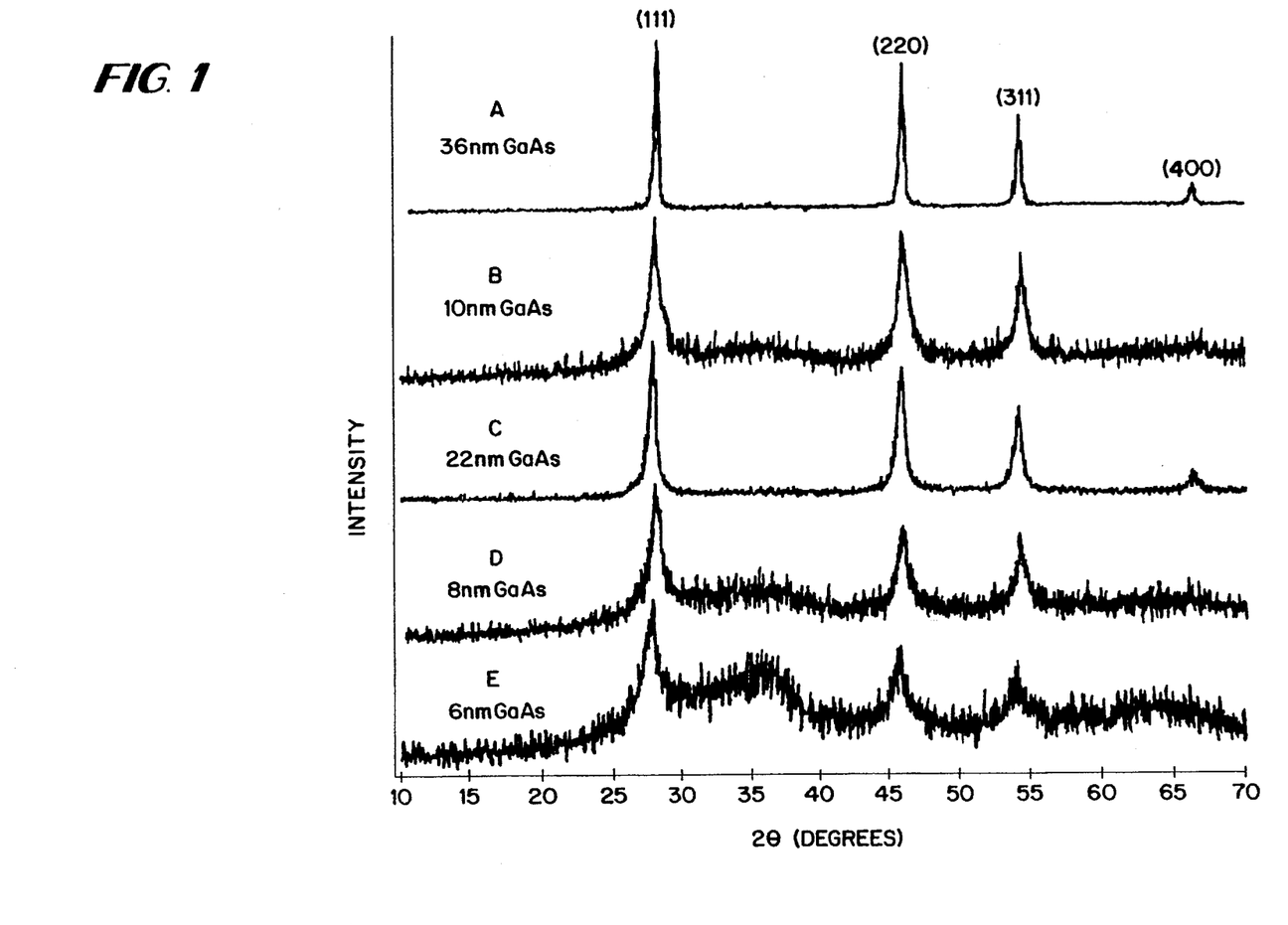
FIG. 1. The effect of solvents, reaction conditions and the nature of Group III halide on GaAs particle size as calculated from XRD patterns. In all the reactions, $GaCl_3$ solutions were added to $(Na/K)_3As$ suspension in toluene.
Figure 2:
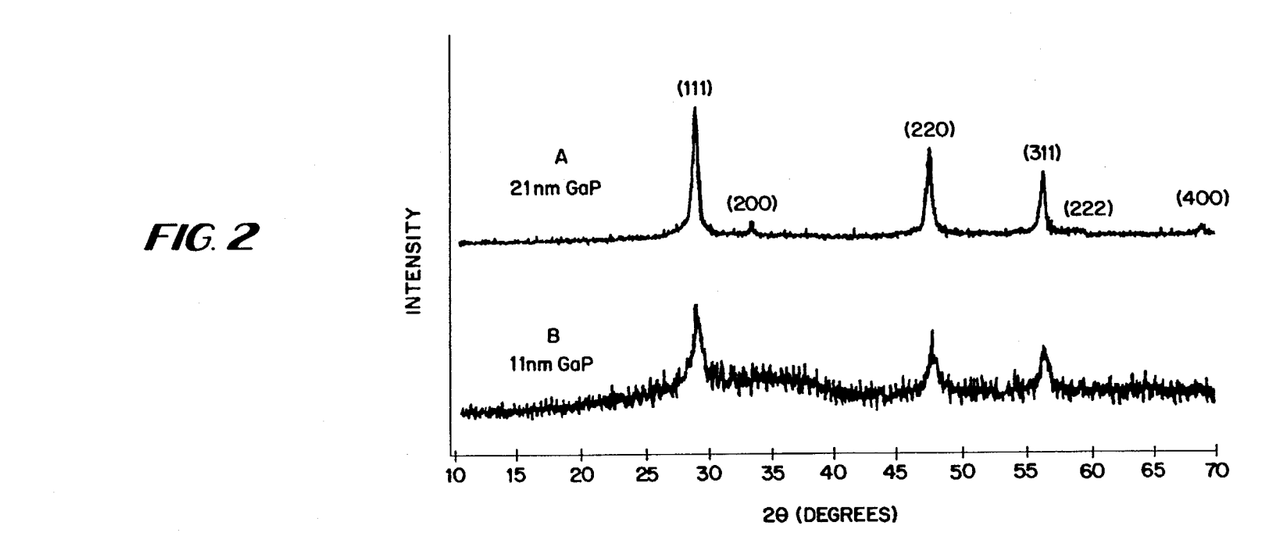
FIG. 2. The effects of solvent on the particle size of GaP as calculated from XRD patterns. In all the experiments, $GaCl_3$ solution was added to $(Na/K)_3P$ suspension in toluene.

It was important to prepare the pnictides in aromatic solvent and toluene was chosen due to its higher boiling point. The effect of diglyme on the particle size is evident from FIG. 1. When $GaCl_3$ was dissolved in toluene and allowed to react with $(Na/K)_3As$ in toluene, GaAs was formed with average particle size of 36 nm (FIG. 1A). However, on dissolving $GaCl_3$ in diglyme and carrying out the reaction under similar conditions, 10 nm crystallites of GaAs were obtained (FIG. 1B). The effect of concentration on the particle size is shown in FIG. 1C. On doubling the amounts of reactants for the same amounts of solvents, larger average particle size of 22 nm resulted. The larger amount of solvent should effectively cause better heat dissipation from the reacting species. The effect of temperature on the particle size is shown in FIG. 1D. On adding $GaCl_3$ solution in diglyme to the pnictide suspension in toluene and stirring at room temperature, without refluxing, resulted in average particle size of 8 nm. The nature of the halide used also played an important role in determining the particle size. As shown in FIG. 1E, when $GaI_3$ dissolved in diglyme was used as the gallium source, 6 nm GaAs particles resulted. FIG. 2A shows that 21 nm GaP particles were produced when $GaCl_3$ solution in toluene was used but the particle size of GaP dropped to 11 nm on using $GaCl_3$ solution in diglyme (FIG. 2B). The role of diglyme is not yet clear although, the fact that ether solvents form adducts with Group III compounds is known (Wilkinson, G., Ed., Pergamon Press: Oxford, Comprehensive Coordination Chemistry, 3, Chapters 24–25 (1987)). Group III halides, generally, exist as dimers due to the Lewis acidity of the Group III metal atom, however, Nöth and coworkers reported that the glyme solvents tend to break up the dimeric structures of these halides and form ionic coordination complexes by expanding the coordination sphere of the metal center (Böck et al, Z. Naturforsch 45b:979 (1990); Nöth et al, Z. Naturforsch 37b:29 (1981)). These ionic complexes may limit the growth of particles/clusters beyond a certain size.

Figure 3A:
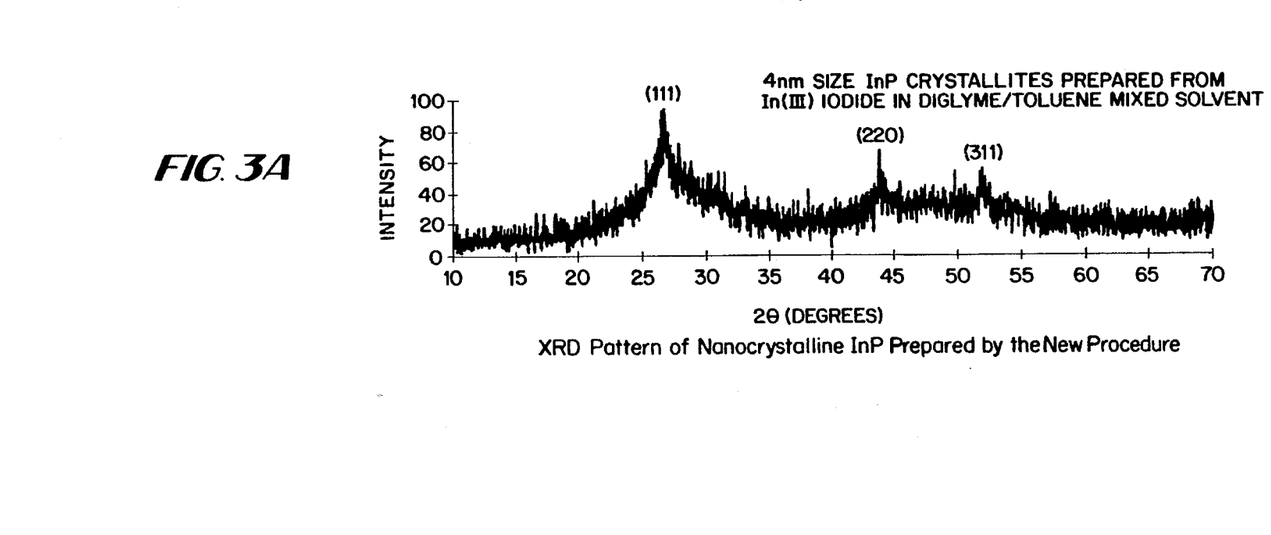
FIG. 3A. XRD pattern of InP synthesized in a diglyme/toluene mixed solvent.
Figure 3B:
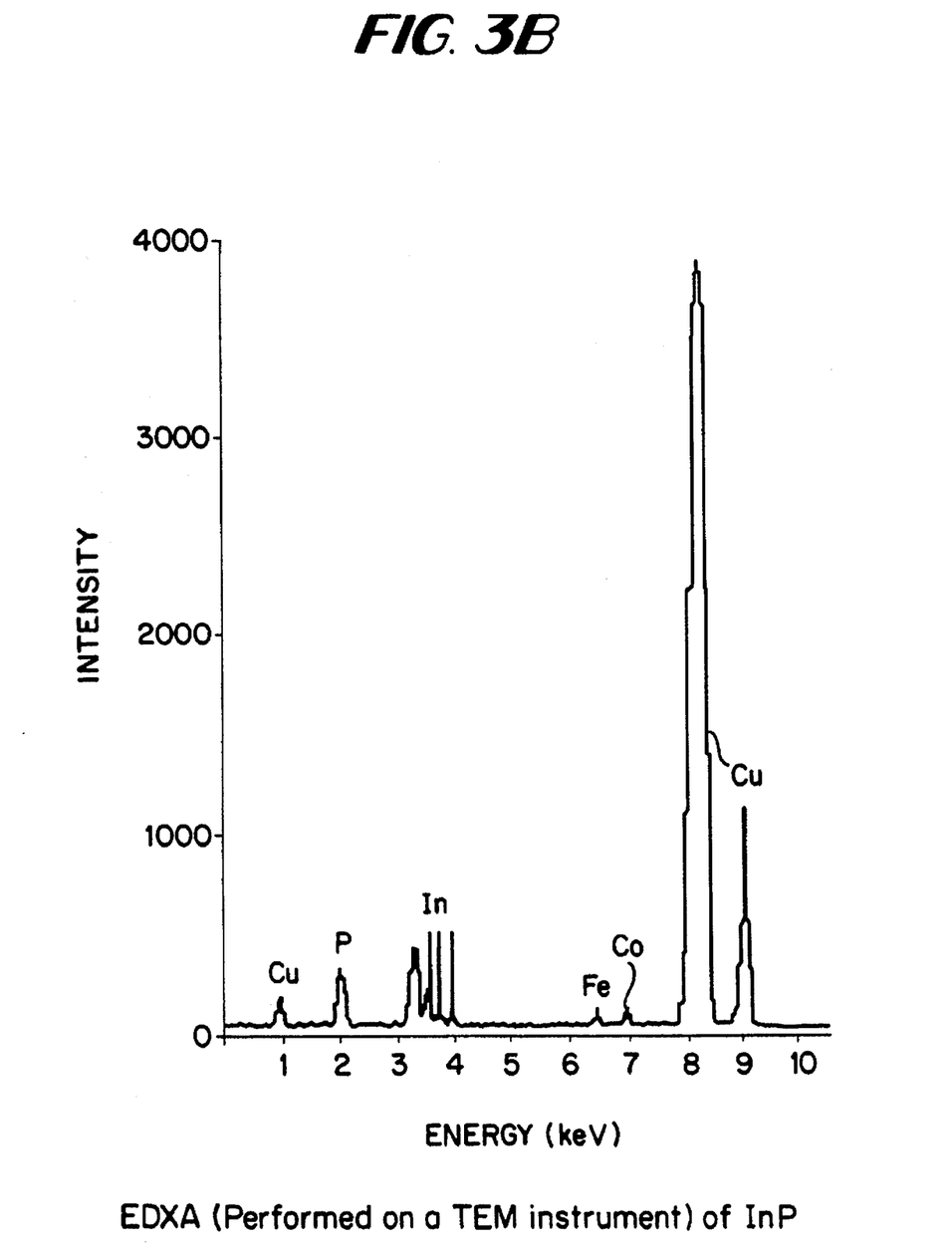
FIG. 3B. EDXA of InP.
Figure 3C:
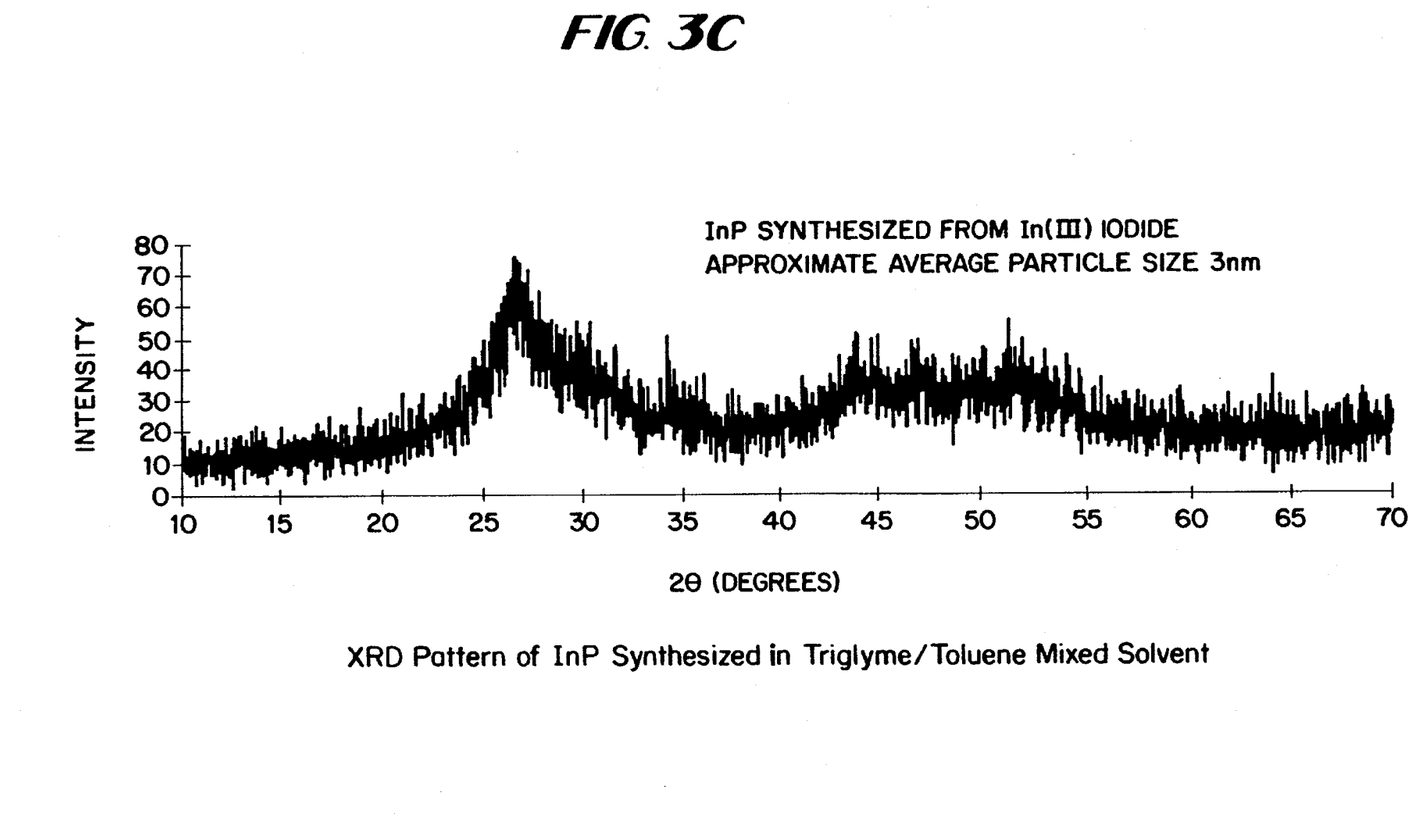
FIG. 3C. XRD pattern of InP synthesized in a triglyme/toluene mixed solvent.

Other III-V semiconductors (InP, InAs, InSb, GaSb) were synthesized using similar procedures to those described above with reference to GaAs and GaP. In the case of InP, if 30% excess white phosphorus was not used then the XRD of the final material indicated the presence of free indium metal which was probably due to incomplete formation of $(Na/K)_3P$ causing unreacted (Na/K) to reduce the indium halide to free indium. In experiments where a minimum of 30% excess of white phosphorus was used, free indium metal was not detected. The average particle size of a typical InP sample synthesized in a diglyme/toluene mixed solvent from $InI_3$ and $(Na/K)_3P$ was 4 nm (see FIG. 3A) and the elemental analysis showed the typical In:P ratio to be 1.0:1.0 within experimental error. The EDXA (Energy Dispersive X-Ray Analysis) of the InP showed the sample contained only In and P (see FIG. 3B). The Cu signals were from the TEM (Transmission Electron Microscope) sample grid and the Fe and Co signals originated from the TEM pole-piece. The XRD pattern of InP synthesized in a triglyme/toluene mixed solvent shows an approximate particle size of 3 nm (see FIG. 3C).

Figure 4:
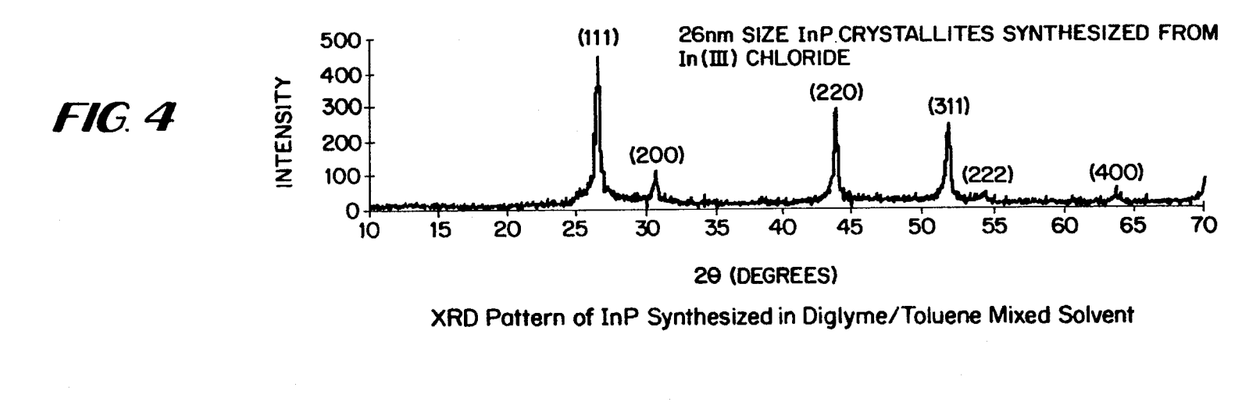
FIG. 4. XRD pattern of InP synthesized from $InCl_3$ in a diglyme/toluene mixed solvent.
Figure 5:
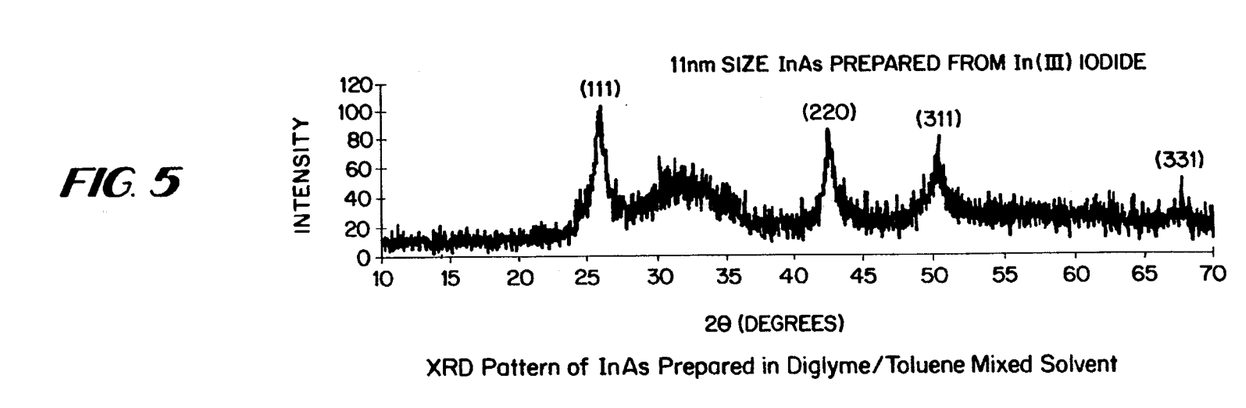
FIG. 5. XRD pattern of InAs prepared from $InI_3$ in a diglyme/toluene mixed solvent.
Figure 6:
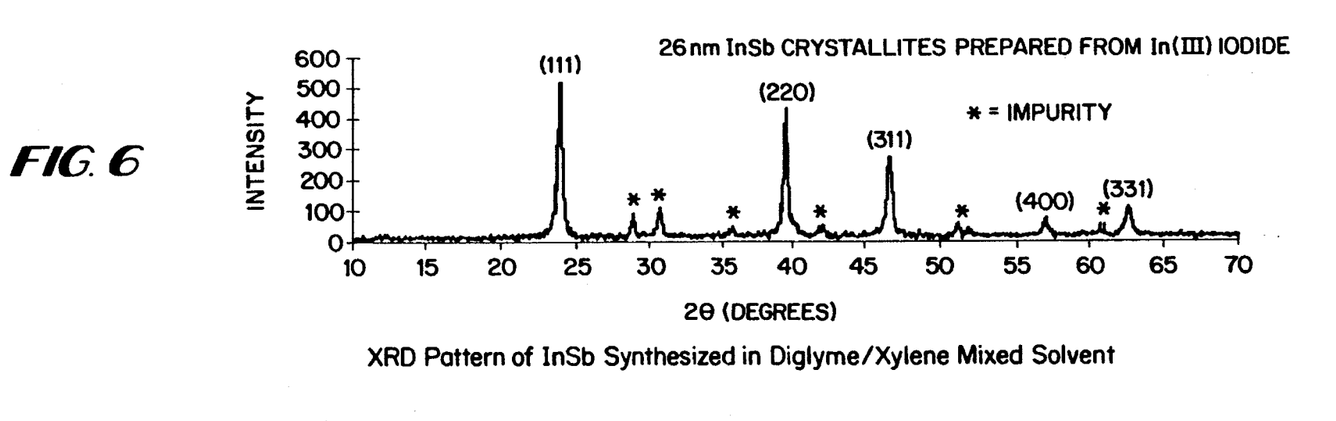
FIG. 6. XRD pattern of InSb synthesized from $InI_3$ in a diglyme/xylene mixed solvent.
Figure 7:
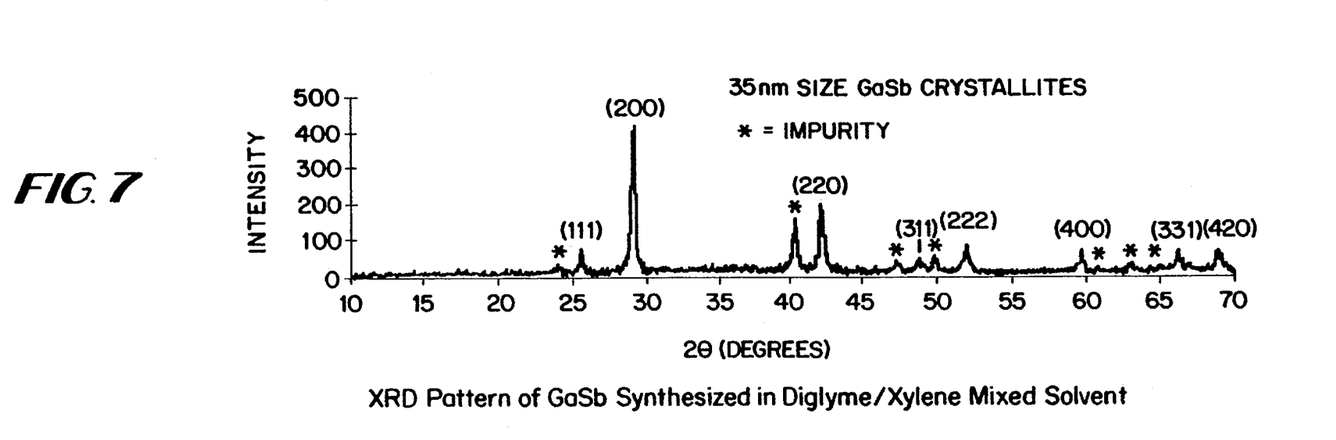
FIG. 7. XRD pattern of GaSb synthesized from $GaCl_3$ in a diglyme/xylene mixed solvent.

On replacing indium iodide with indium chloride or indium bromide, InP with an average particle size of approximately 26 nm was obtained in both cases (see FIG. 4). The reaction of $InI_3$ (in diglyme) with $(Na/K)_3As$ (in toluene) produced InAs nanocrystals with an average particle size of 11 nm (see FIG. 5). The elemental analysis of typical InAs indicated the In:As ratio to be 5.0:4.0. InSb was prepared from the reaction of $InI_3$ (in diglyme) with $(Na/K)_3Sb$ (in xylene). The In:Sb ratio was found to be 1:1 and the XRD indicated the particle size to be 26 nm (see FIG. 6). Reactions of $GaCl_3$ (in diglyme) with $(Na/K)_3Sb$ (in xylene) produced GaSb with an average particle size of 35 nm (see FIG. 7) and the Ga:Sb ratio was observed to be 1:1. The main impurity in the InSb and GaSb XRD patterns was found to be free antimony.

All documents cited above are hereby incorporated in their entirety by reference.

One skilled in the art will appreciate from a reading of this disclosure that various changes in form and detail can be made without departing from the true scope of the invention.

What is claimed is:

1. A method of synthesizing a Group III-V nanocrystalline semiconductor comprising:
   i) forming a mixture comprising a pnictide $((Na/K)_3E)$ by mixing a sodium/potassium (Na/K) alloy with an excess of Group VA (E) element in an aromatic solvent
   ii) mixing the $(Na/K)_3E$ resulting from step (i) with a solution comprising a Group IIIA trihalide $(MX_3)$ in the presence of a coordinating solvent so that a suspension comprising said Group III-V nanocrystalline semiconductor (ME) and (Na/K)X is formed; and
   iii) isolating ME resulting from step (ii).

2. The method according to claim 1 wherein E is selected from the group consisting of P, As and Sb.

3. The method according to claim 2 wherein E is selected from the group consisting of P and As.

4. The method according to claim 1 wherein said Group IIIA trihalide is selected from the group consisting of gallium trihalide, indium trihalide, aluminum trihalide and boron trihalide.

5. The method according to claim 4 wherein said Group IIIA trihalide is selected from the group consisting of gallium trihalide and indium trihalide.

6. The method according to claim 1 wherein said aromatic solvent is selected from the group consisting of toluene and xylene.

7. The method according to claim 1 wherein said aromatic solvent comprising said Na/K alloy and E is refluxed so that $(Na/K)_3E$ is formed.

8. The method according to claim 1 wherein said coordinating solvent is a glyme solvent.

9. The method according to claim 1 wherein said mixture of the $(Na/K)_3E$ resulting from step (i) and the solution comprising a Group IIIA trihalide and the coordinating solvent is refluxed so that said Group III-V nanocrystalline semiconductor is formed.

10. The method according to claim 1 wherein said isolating step (iii) comprising:
    a) harvesting solid material present in said suspension resulting from step (ii), which solid material comprises said ME and (Na/K)X, unreacted $MX_3$ or excess E;
    b) washing said harvested solid material under conditions such that (Na/K)X and unreacted $MX_3$ are separated from said ME.

11. The method according to claim 10 further comprising, removing excess E from solid material resulting from step (b).

12. The method according to claim 1 wherein said ME has a particle size of 3–38 nm.

* * * * *

UNITED STATES PATENT AND TRADEMARK OFFICE
CERTIFICATE OF CORRECTION

PATENT NO. : 5,474,591
DATED : December 12, 1995
INVENTOR(S) : WELLS et al

It is certified that error appears in the above-indentified patent and that said Letters Patent is hereby corrected as shown below:

Column 1 line 4, insert

--This invention was made with Government support under Grant No. F496209310004 awarded by the Air Force. The Government has certain rights in the invention.--

Signed and Sealed this

Eighth Day of October, 1996

Attest:

BRUCE LEHMAN

Attesting Officer     Commissioner of Patents and Trademarks